(12) United States Patent
Hashima

(10) Patent No.: US 12,321,098 B2
(45) Date of Patent: Jun. 3, 2025

(54) SUBSTRATE SUPPORT MEMBER, SUBSTRATE TREATMENT APPARATUS, AND SUBSTRATE TRANSFER APPARATUS

(71) Applicant: Tokyo Electron Limited, Tokyo (JP)

(72) Inventor: Hitoshi Hashima, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 481 days.

(21) Appl. No.: 16/771,878

(22) PCT Filed: Dec. 7, 2018

(86) PCT No.: PCT/JP2018/045120
§ 371 (c)(1),
(2) Date: Jun. 11, 2020

(87) PCT Pub. No.: WO2019/124119
PCT Pub. Date: Jun. 27, 2019

(65) Prior Publication Data
US 2021/0173306 A1    Jun. 10, 2021

(30) Foreign Application Priority Data
Dec. 21, 2017   (JP) .................................. 2017-244724

(51) Int. Cl.
*H01L 21/687*   (2006.01)
*G03F 7/00*   (2006.01)
*G03F 7/16*   (2006.01)

(52) U.S. Cl.
CPC .............. *G03F 7/162* (2013.01); *G03F 7/707* (2013.01); *H01L 21/68764* (2013.01)

(58) Field of Classification Search
CPC .................. H01L 21/6876; H01L 21/6874
See application file for complete search history.

(56) References Cited

U.S. PATENT DOCUMENTS 5,665,167 A    9/1997  Deguchi et al.
5,900,062 A *  5/1999  Loewenhardt ...... H01L 21/6831
                                                 307/130
(Continued)

FOREIGN PATENT DOCUMENTS

JP   H01-115186 U   8/1989
JP   H01-142181 U   9/1989
(Continued)

OTHER PUBLICATIONS

International Search Report of the International Searching Authority mailed Feb. 19, 2019 for the corresponding International patent application No. PCT/JP2018/045120 (and English translation).

(Continued)

*Primary Examiner* — Vu A Vu
*Assistant Examiner* — Valerie N Newton
(74) *Attorney, Agent, or Firm* — Posz Law Group, PLC

(57) ABSTRACT

A solution treatment apparatus performs a solution treatment on a substrate using treatment solution. The solution treatment apparatus includes a substrate holder that rotates and holds the substrate; a nozzle that supplies the treatment solution to the substrate on the substrate holder, and raising and lowering pins that raise and lower the substrate above a stage for the substrate. One or more of the pins has a main body having a conductivity; and an inductor part provided outside the main body. The main body has a top portion that comes into contact with the substrate and supports the substrate. A side of the main body opposite to the top portion across the inductor part is directly or indirectly grounded.

7 Claims, 12 Drawing Sheets

(56) References Cited

U.S. PATENT DOCUMENTS

| | | | | |
|---|---|---|---|---|
| 6,108,189 A | * | 8/2000 | Weldon | C23C 16/4586 |
| | | | | 279/128 |
| 2002/0039499 A1 | * | 4/2002 | Kamei | G03G 15/0233 |
| | | | | 399/176 |
| 2004/0096367 A1 | * | 5/2004 | Schermer | G01N 1/10 |
| | | | | 436/180 |
| 2009/0201118 A1 | * | 8/2009 | Rajabhau | H01F 41/0233 |
| | | | | 29/605 |
| 2013/0337635 A1 | * | 12/2013 | Yamawaku | H01L 21/02164 |
| | | | | 118/723 ER |

FOREIGN PATENT DOCUMENTS

| | | |
|---|---|---|
| JP | H05-243364 A | 9/1993 |
| JP | H06-326180 A | 11/1994 |
| JP | 2000-269038 A | 9/2000 |
| JP | 2016-157822 A | 9/2016 |
| TW | 201109671 A | 3/2011 |

OTHER PUBLICATIONS

Office Action issued Sep. 13, 2022 in corresponding Taiwanese Patent Application No. 11120901240 (p. 1 only).

* cited by examiner

SUBSTRATE SUPPORT MEMBER, SUBSTRATE TREATMENT APPARATUS, AND SUBSTRATE TRANSFER APPARATUS

CROSS-REFERENCE TO RELATED APPLICATIONS

This application is based upon and claims the benefit of priority of the prior Japanese Patent Application No. 2017-244724, filed in Japan on Dec. 21, 2017, the entire contents of which are incorporated herein by reference.

TECHNICAL FIELD

The present invention relates to a substrate support member supporting a substrate when delivering the substrate onto/from a stage in a substrate treatment apparatus, a substrate treatment apparatus using the substrate support member, and a substrate transfer apparatus.

BACKGROUND ART

In a photolithography step in a manufacturing process of a semiconductor device, for example, a coating treatment of applying a predetermined coating solution, for example, onto a semiconductor wafer (hereinafter, referred to as a "wafer") as a substrate to form a coating film such as an anti-reflection film or a resist film is performed. As the coating treatment method of the coating solution, a so-called spin coating method is widely used which supplies the coating solution from a nozzle to a central portion of the wafer in rotation and diffuses the coating solution on the wafer by the centrifugal force to thereby form the coating film on the wafer.

In the spin coating method, rotational friction occurs between the coating solution and the wafer because the wafer is rotated when the coating solution is supplied, so that static electricity is generated due to the rotational friction in some cases. If the static electricity is generated in the wafer treatment as above, an excessive current comes to instantaneously flow on the wafer, possibly causing a problem such as breakage of an oxide film formed on the wafer, breakage of a joint portion, or fusion of a wiring film, together with a decrease in ESD (Electro Static Discharge) resistance accompanying miniaturization of a semiconductor integrated circuit in recent years.

To prevent the occurrence of such a problem caused by static electricity, for example, Patent Document 1 discloses destaticization by grounding the wafer, or a transfer mechanism or a treatment mechanism in contact with the wafer via a resistor of a predetermined value or a material having a predetermined resistance value.

PRIOR ART DOCUMENT

Patent Document

Patent Document 1: Japanese Laid-open Patent Publication No. H5-243364

DISCLOSURE OF THE INVENTION

Problems to be Solved by the Invention

Incidentally, the ESD occurring on the wafer has at least two kinds of waveforms.

One of them is a current waveform that a current having a small discharge charge amount but having a steep peak flows in a short period (for example, several nanoseconds or less), causing a steep potential change in an internal circuit being an object to be protected since an ESD protection element (resistor, diode, transistor or the like) cannot respond thereto because of its small time constant, thus possibly causing a latent malfunction even if the aforementioned breakage of the oxide film or a complete breakage does not occur.

The other one of them is a current waveform that a large current having a large discharge charge amount flows in a long period (for example, about 100 nanoseconds), causing Joule heat due to a large current flowing into the ESD protection element though the ESD protection element is enough to respond to its time constant, thus possibly causing the aforementioned breakage of the joint portion or fusion of the wiring film due to thermal breakdown.

When grounding the wafer, or the transfer mechanism or treatment mechanism in contact with the wafer via the resistor of the predetermined value or the material having the predetermined resistance value as disclosed in Patent Document 1, the ESD current can be further limited as the resistance value is larger, but the wafer is transferred to the next step without sufficient leakage of the charge on the wafer, causing a poor condition.

The present invention has been made in consideration of the above point, and its object is to prevent the occurrence of an electric characteristic defect by making charge on a wafer easily leak while limiting an ESD current.

Means for Solving the Problems

To achieve the above object, one aspect of the present invention is a substrate support member for supporting a substrate, including: a conductive part having a conductivity; and an inductor part provided outside the conductive part, wherein: the conductive part is formed with a contact support configured to come into contact with the substrate and support the substrate; and a side of the conductive part opposite to the contact support across the inductor part is directly or indirectly grounded.

Effect of the Invention

According to an aspect of the present invention, it is possible to appropriately cope with a case where an ESD current having a steep peak flows in a short period so as to prevent the occurrence of an electric characteristic defect due to the flow.

EMBODIMENTS FOR CARRYING OUT THE INVENTION

Figure 1:
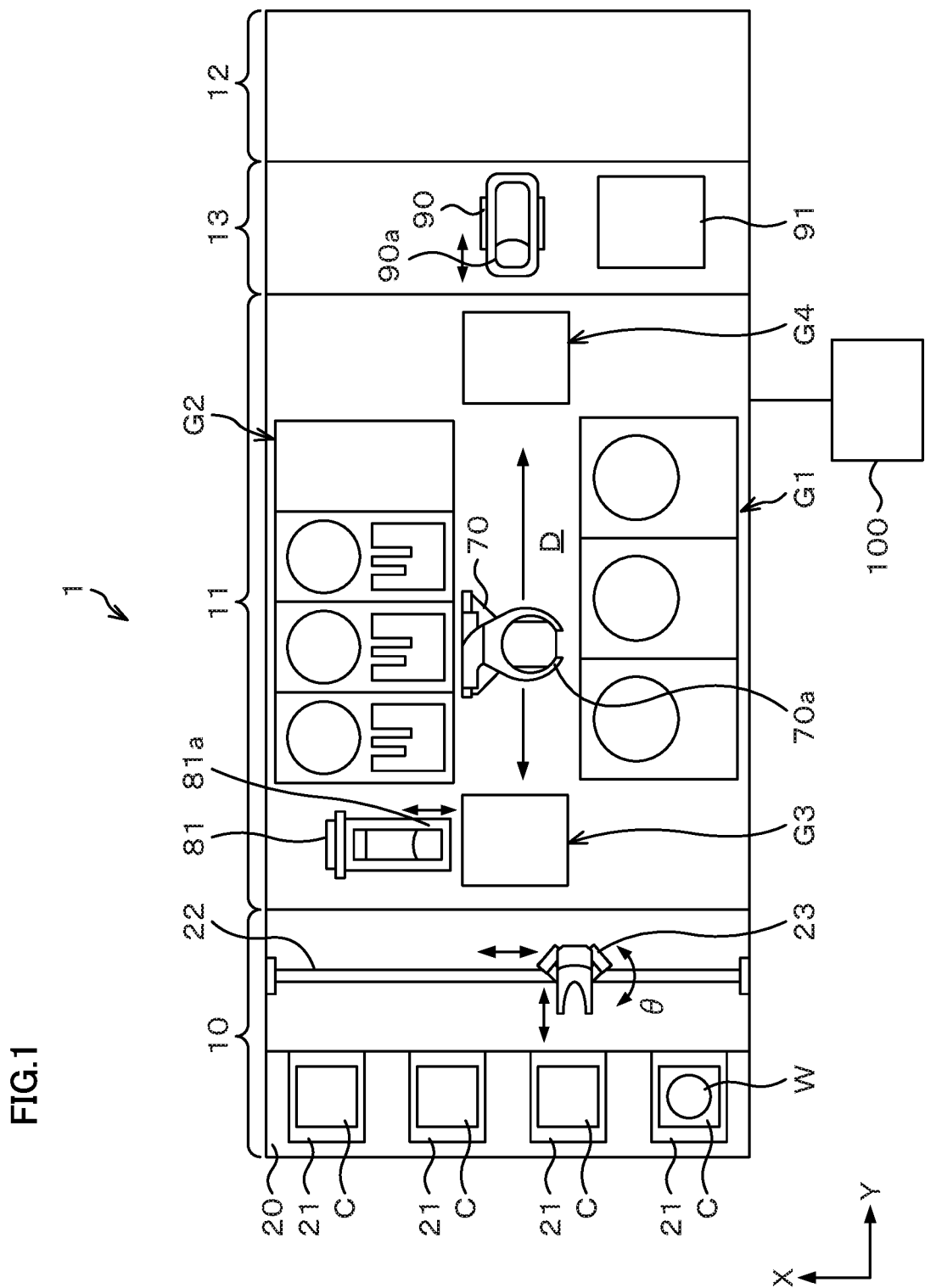
FIG. 1 is a plan view schematically illustrating the outline of a substrate treatment system having a solution treatment apparatus according to an embodiment.

Hereinafter, embodiments of the present invention will be explained referring to the drawings. Note that the same codes are given to components having substantially the same functional configurations in the description and the drawings to omit duplicated explanation. Note that in the embodiments, a case where a substrate support member is applied to a solution treatment apparatus which performs a solution treatment, for example, on a wafer W will be explained.

Configuration of a Substrate Treatment System

Figure 2:
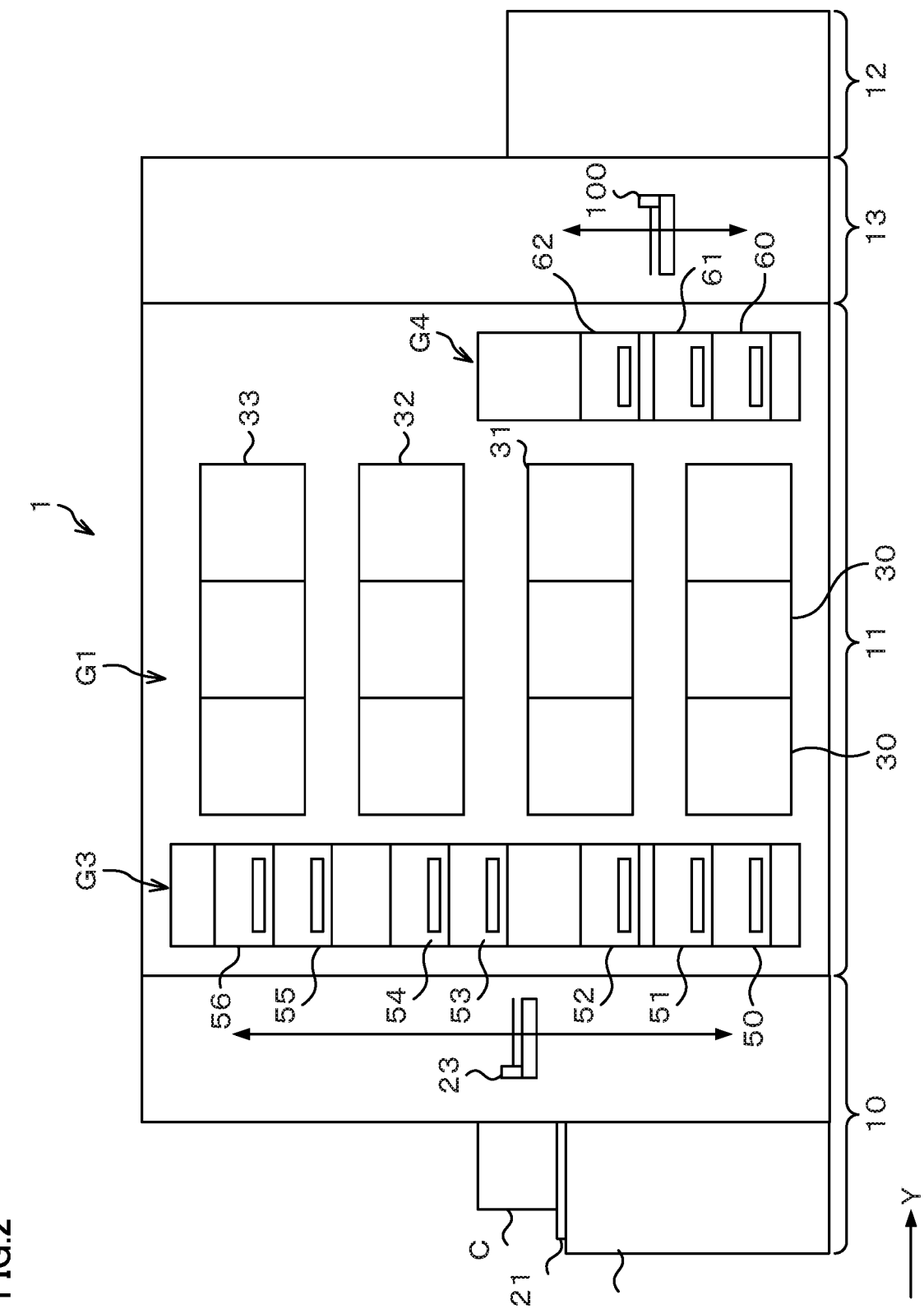
FIG. 2 is a front view of the substrate treatment system.
Figure 3:
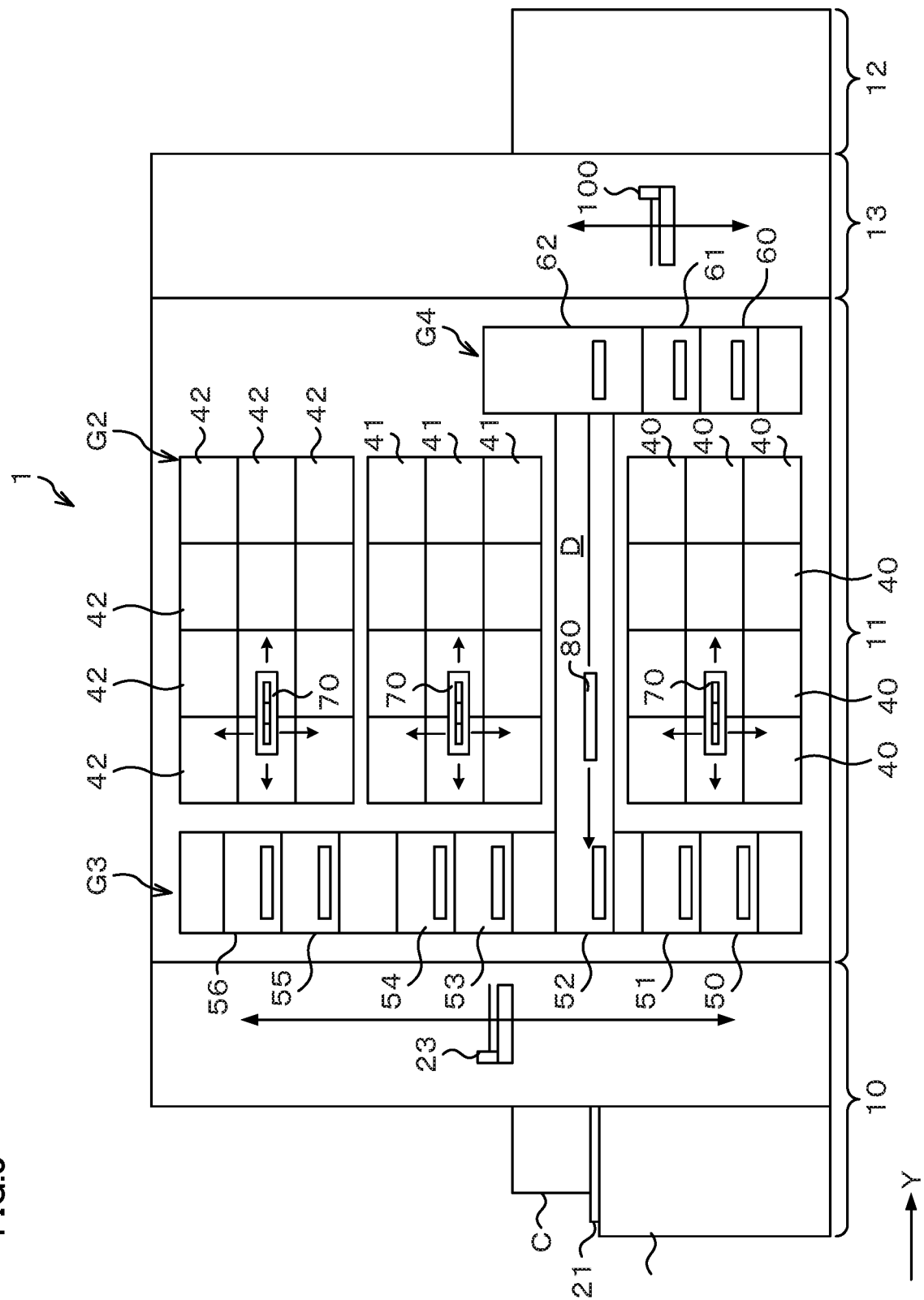
FIG. 3 is a rear view of the substrate treatment system.

A configuration of a substrate treatment system including a solution treatment apparatus according to this embodiment will be explained. FIG. 1 is a plan view schematically illustrating the outline of a configuration of a substrate treatment system 1. FIG. 2 and FIG. 3 are a front view and a rear view schematically illustrating the outline of the internal configuration of the substrate treatment system 1, respectively. In the substrate treatment system 1, predetermined treatments are performed on a wafer W as a substrate.

The substrate treatment system 1 includes, as illustrated in FIG. 1, a cassette station 10 into/out of which a cassette C housing a plurality of wafers W is transferred, a treatment station 11 including a plurality of various treatment apparatuses which perform the predetermined treatments on the wafer W, and an interface station 13 which delivers the wafer W to/from an exposure apparatus 12 adjacent to the treatment station 11, are integrally connected.

In the cassette station 10, a cassette stage 20 is provided. On the cassette stage 20, a plurality of cassette stage plates 21 on each of which the cassette C is mounted when the cassette C is transferred in/out from/to the outside of the substrate treatment system 1 are provided.

In the cassette station 10, a wafer transfer apparatus 23 is provided which is movable on a transfer path 22 extending in an X-direction as illustrated in FIG. 1. The wafer transfer apparatus 23 is movable also in an up-down direction and around a vertical axis (in a θ-direction), and can transfer the wafer W between the cassette C on each of the cassette stage plates 21 and a delivery apparatus in a later-explained third block G3 in the treatment station 11.

In the treatment station 11, a plurality of, for example, four blocks, namely, a first block G1 to a fourth block G4 each including various apparatuses are provided. For example, the first block G1 is provided on the front side (an X-direction negative direction side in FIG. 1) in the treatment station 11, and the second block G2 is provided on the rear side (an X-direction positive direction side in FIG. 1, the upper side in the drawing) in the treatment station 11. Further, the aforementioned third block G3 is provided on the cassette station 10 side (a Y-direction negative direction side in FIG. 1) in the treatment station 11. The fourth block G4 is provided on the interface station 13 side (a Y-direction positive direction side in FIG. 1) in the treatment station 11.

For example, in the first block G1, as illustrated in FIG. 2, a plurality of solution treatment apparatuses, for example, developing treatment apparatuses 30 each of which performs a developing treatment on the wafer W, lower anti-reflection film forming apparatuses 31 each of which forms an anti-reflection film (hereinafter, referred to as a "lower anti-reflection film") at a lower layer of a resist film of the wafer W, resist coating apparatuses 32 each of which applies a resist solution to the wafer W to form a resist film, and upper anti-reflection film forming apparatuses 33 each of which forms an anti-reflection film (hereinafter, referred to as an "upper anti-reflection film") at an upper layer of the resist film of the wafer W, are arranged in this order from the bottom.

For example, three pieces of each of the developing treatment apparatus 30, the lower anti-reflection film forming apparatus 31, the resist coating apparatus 32, and the upper anti-reflection film forming apparatus 33 are arranged side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

For example, in the second block G2, as illustrated in FIG. 3, thermal treatment apparatuses 40 each of which performs thermal treatments such as heating and cooling on the wafer W, hydrophobic treatment apparatuses 41 each of which performs a hydrophobic treatment for enhancing fixation between the resist solution and the wafer W, and edge exposure apparatuses 42 each of which exposes the outer peripheral portion of the wafer W, are provided side by side in the up-down direction and in the horizontal direction. The numbers and the arrangement of the thermal treatment apparatuses 40, the hydrophobic treatment apparatuses 41, and the edge exposure apparatuses 42 can also be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

A wafer transfer region D is formed in a region surrounded by the first block G1 to the fourth block G4 as illustrated in FIG. 1. In the wafer transfer region D, for example, a plurality of wafer transfer apparatuses 70 are arranged each of which has a transfer arm 70a movable, for example, in the Y-direction, the X-direction, the θ-direction, and the up-down direction. The wafer transfer apparatus 70 can move in the wafer transfer region D to transfer the wafer W to a predetermined apparatus in the first block G1, the second block G2, the third block G3, and the fourth block G4 located therearound.

Further, in the wafer transfer region D, a shuttle transfer apparatus 80 is provided which linearly transfers the wafer W between the third block G3 and the fourth block G4 as illustrated in FIG. 3.

The shuttle transfer apparatus 80 is configured to be linearly movable, for example, in the Y-direction in FIG. 3. The shuttle transfer apparatus 80 can move in the Y-direction while supporting the wafer W, and transfer the wafer W between the delivery apparatus 52 in the third block G3 and the delivery apparatus 62 in the fourth block G4.

As illustrated in FIG. 1, a wafer transfer apparatus 81 is provided adjacent on the X-direction positive direction side of the third block G3. The wafer transfer apparatus 81 has a transfer arm 81a movable, for example, in the X-direction, the θ-direction, and the up-down direction. The wafer transfer apparatus 81 can move up and down while supporting the wafer W to transfer the wafer W to each of the delivery apparatuses in the third block G3.

In the interface station 13, a wafer transfer apparatus 90 and a delivery apparatus 91 are provided. The wafer transfer apparatus 90 has a transfer arm 90a movable, for example, in the Y-direction, the θ-direction, and the up-down direction. The wafer transfer apparatus 90 can transfer the wafer W between each of the delivery apparatuses in the fourth block G4, the delivery apparatus 91, and the exposure apparatus 12, for example, while supporting the wafer W by the transfer arm 90a.

In the above substrate treatment system 1, a control unit 100 is provided as illustrated in FIG. 1. The control unit 100 is, for example, a computer and has a program storage unit (not illustrated). In the program storage unit, a program for controlling the treatments on the wafer W in the substrate treatment system 1 is stored. Further, the program storage unit also stores programs for controlling the operations of the above-explained various treatment apparatuses and a driving system such as the transfer apparatuses to realize a later-described solution treatment in the substrate treatment system 1. Note that the above programs may be the ones which are recorded, for example, on a computer-readable storage medium such as a computer-readable hard disk (HD), flexible disk (FD), compact disk (CD), magneto-optical disk (MO), or memory card, and installed from the storage medium into the control unit 100.

Operation of the Substrate Treatment System

Next, the wafer treatment performed using the substrate treatment system 1 configured as above will be explained.

First, the cassette C housing a plurality of wafers W is transferred into the cassette station 10 of the substrate treatment system 1 and placed on the cassette stage plate 21. Then, each of the wafers W in the cassette C is successively taken out by the wafer transfer apparatus 23 and transferred to the delivery apparatus 53 in the third block G3 in the treatment station 11.

Then, the wafer W is transferred by the wafer transfer apparatus 70 to the thermal treatment apparatus 40 in the second block G2 and subjected to a temperature regulation treatment. The wafer W is thereafter transferred by the wafer transfer apparatus 70, for example, to the lower anti-reflection film forming apparatus 31 in the first block G1, in which a lower anti-reflection film is formed on the wafer W. The wafer W is then transferred to the thermal treatment apparatus 40 in the second block G2 and subjected to a heat treatment. The wafer W is then returned to the delivery apparatus 53 in the third block G3.

Next, the wafer W is transferred by the wafer transfer apparatus 81 to the delivery apparatus 54 in the same third block G3. Thereafter, the wafer W is transferred by the wafer transfer apparatus 70 to the hydrophobic apparatus 41 in the second block G2 and subjected to a hydrophobic treatment.

Thereafter, the wafer W is transferred by the wafer transfer apparatus 70 to the resist coating apparatus 32, in which a resist film is formed on the wafer W. Thereafter, the wafer W is transferred by the wafer transfer apparatus 70 to the thermal treatment apparatus 40 and subjected to a pre-baking treatment. The wafer W is then transferred by the wafer transfer apparatus 70 to the delivery apparatus 55 in the same third block G3.

Next, the wafer W is transferred by the wafer transfer apparatus 70 to the upper anti-reflection film forming apparatus 33, in which an upper anti-reflection film is formed on the wafer W. The wafer W is then transferred by the wafer transfer apparatus 70 to the thermal treatment apparatus 40 and heated and then temperature-regulated. The wafer W is then transferred to the edge exposure apparatus 42 and subjected to edge exposure processing.

Thereafter, the wafer W is transferred by the wafer transfer apparatus 70 to the delivery apparatus 56 in the third block G3.

Next, the wafer W is transferred by the wafer transfer apparatus 81 to the delivery apparatus 52 and transferred by the shuttle transfer apparatus 80 to the delivery apparatus 62 in the fourth block G4. The wafer W is then transferred by the wafer transfer apparatus 90 in the interface station 13 to the exposure apparatus 12 and subjected to exposure processing in a predetermined pattern.

Next, the wafer W is transferred by the wafer transfer apparatus 90 to the delivery apparatus 60 in the fourth block G4. The wafer W is then transferred by the wafer transfer apparatus 70 to the thermal treatment apparatus 40 and subjected to a post-exposure baking treatment.

Next, the wafer W is transferred by the wafer transfer apparatus 70 to the developing treatment apparatus 30 and subjected to a developing treatment. After the developing treatment ends, the wafer W is transferred by the wafer transfer apparatus 70 to the thermal treatment apparatus 40 and subjected to a post-baking treatment.

Thereafter, the wafer W is transferred by the wafer transfer apparatus 70 to the delivery apparatus 50 in the third block G3, and then transferred by the wafer transfer apparatus 23 in the cassette station 10 to the cassette C on a predetermined cassette stage plate 21. Thus, a series of photolithography process is finished.

Configuration of the Solution Treatment Apparatus

Figure 4:
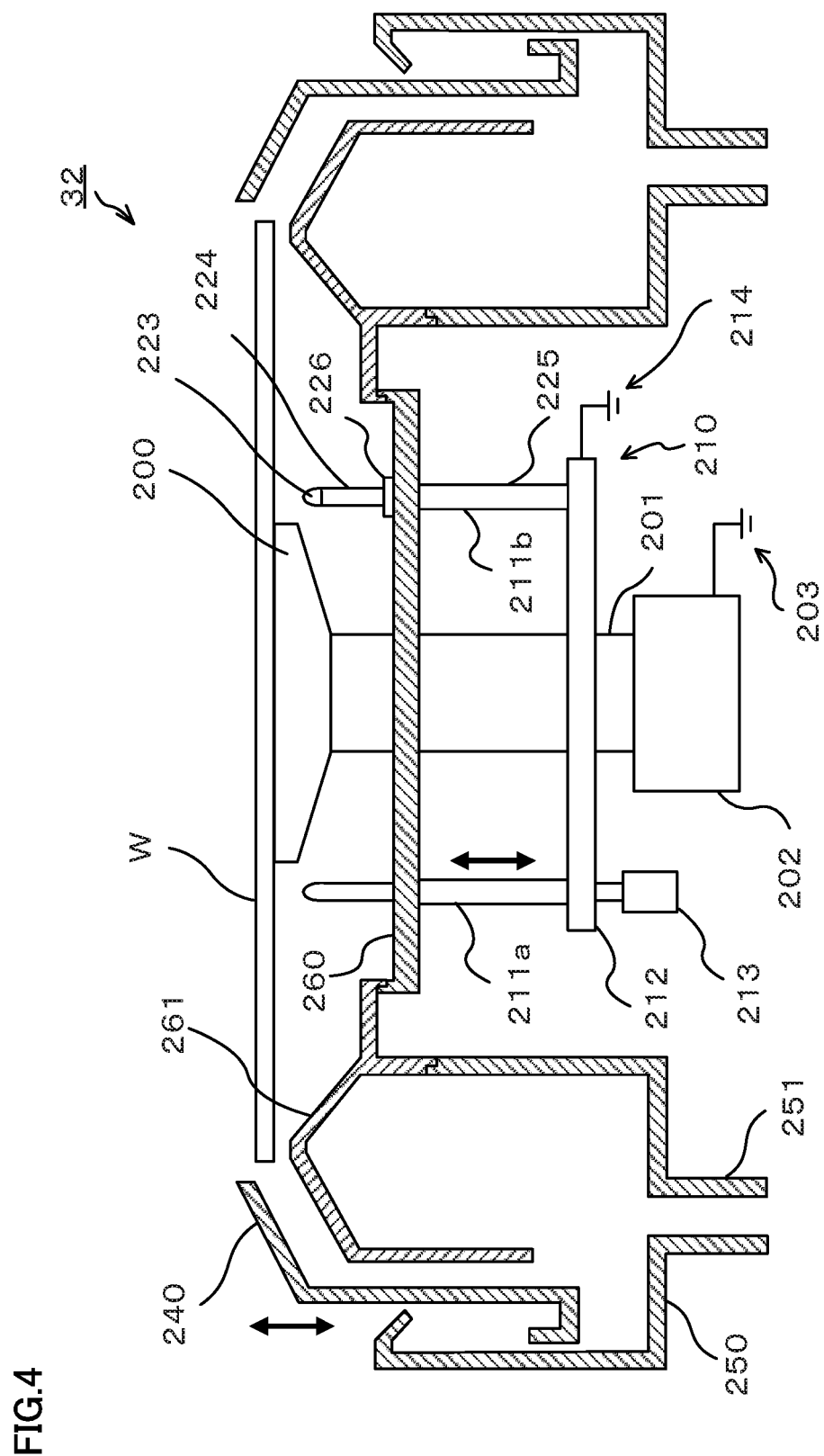
FIG. 4 is a longitudinal sectional view schematically illustrating the outline of a configuration of the solution treatment apparatus according to the embodiment.
Figure 5:
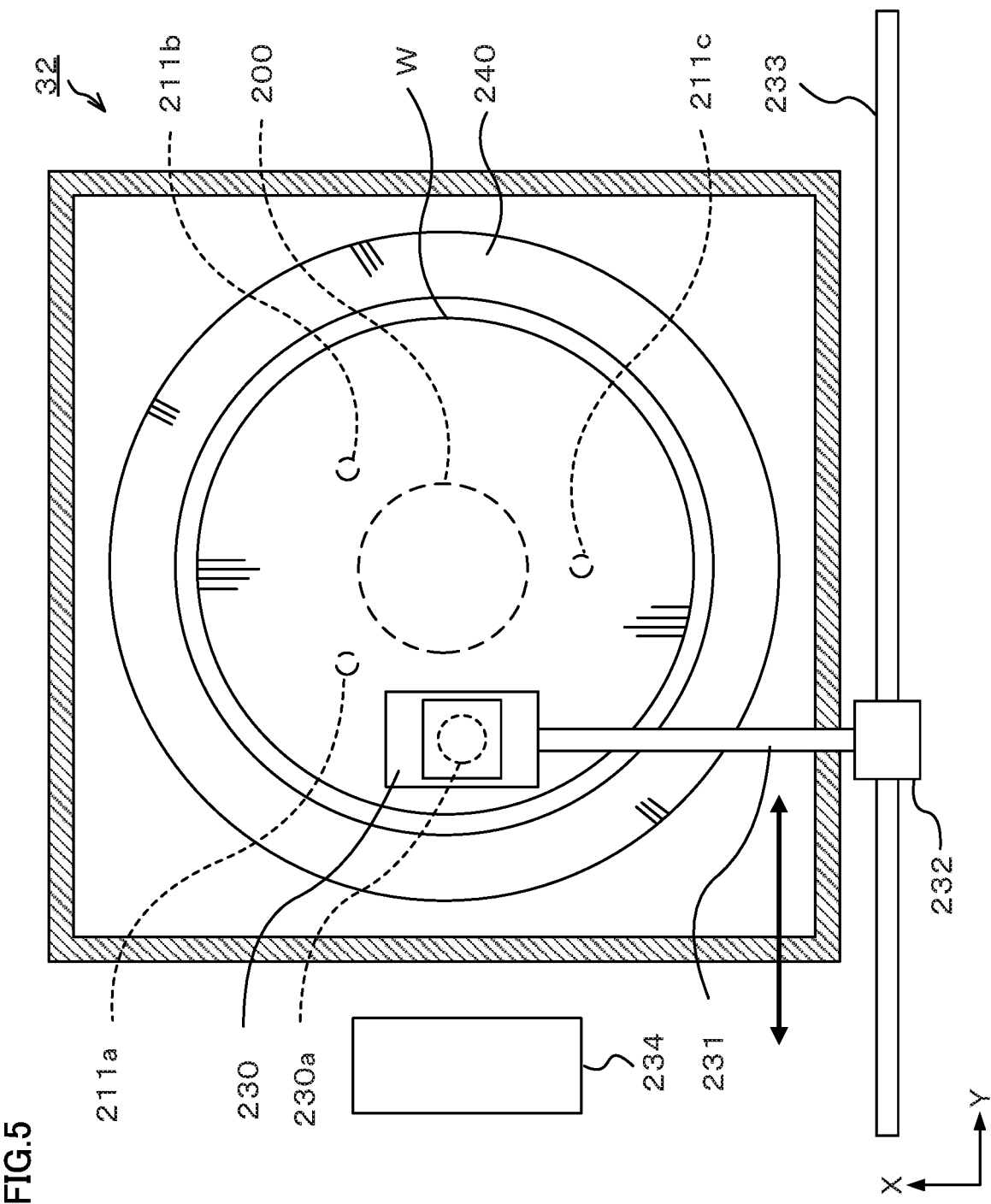
FIG. 5 is a transverse sectional view of the solution treatment apparatus.

Next, the configuration of the solution treatment apparatus according to the embodiment of the present invention, for example, the resist coating apparatus 32 will be explained. FIG. 4 is a longitudinal sectional view schematically illustrating the outline of the configuration of the resist coating apparatus 32, and FIG. 5 is a transverse sectional view schematically illustrating the outline of the configuration of the resist coating apparatus 32.

In the resist coating apparatuses 32, a spin chuck 200 as a substrate holder which holds the wafer W is provided as illustrated in FIG. 4. The spin chuck 200 has a horizontal upper surface, and the upper surface is provided with, for example, a suction port (not illustrated) for sucking the wafer W. By suction through the suction port, the wafer W can be suction-held on the spin chuck 200. Note that in this embodiment, the spin chuck 200 is composed of a conductive resin having an electrostatic diffusive resistance value region made of, for example, polyether ether keton (PEEK) and carbon fiber (CF), and thus has an electrostatic diffusive resistance value region having a resistance value of, for example, $10^5\Omega$ to $10^9\Omega$.

The spin chuck 200 is connected via a shaft 201 to a driver 202 provided below the spin chuck 200, and the driver 202 is connected to a ground wire 203. By the driver 202, the spin chuck 200 can rotate at a predetermined speed and the spin chuck 200 can freely rise and lower.

On the rear surface side of the wafer W held by the spin chuck 200, a substrate support 210 is provided for supporting the wafer W from below and raising and lowering the wafer W is provided. The substrate support 210 is composed of, for example, three raising and lowering pins 211a, 211b, 211c as substrate support members according to this embodiment, a ring member 212, a raising and lowering part 213, and a ground connector 214. The raising and lowering pins 211a, 211b, 211c as the substrate support members are connected to the raising and lowering part 213 via the ring member 212 and can freely rise and lower. This makes the raising and lowering pins 211a, 211b, 211c freely protrude upward from the spin chuck 200 to be able to give and receive the wafer W to/from the already-explained transfer arm 70a of the wafer transfer apparatus 70.

Figure 6:
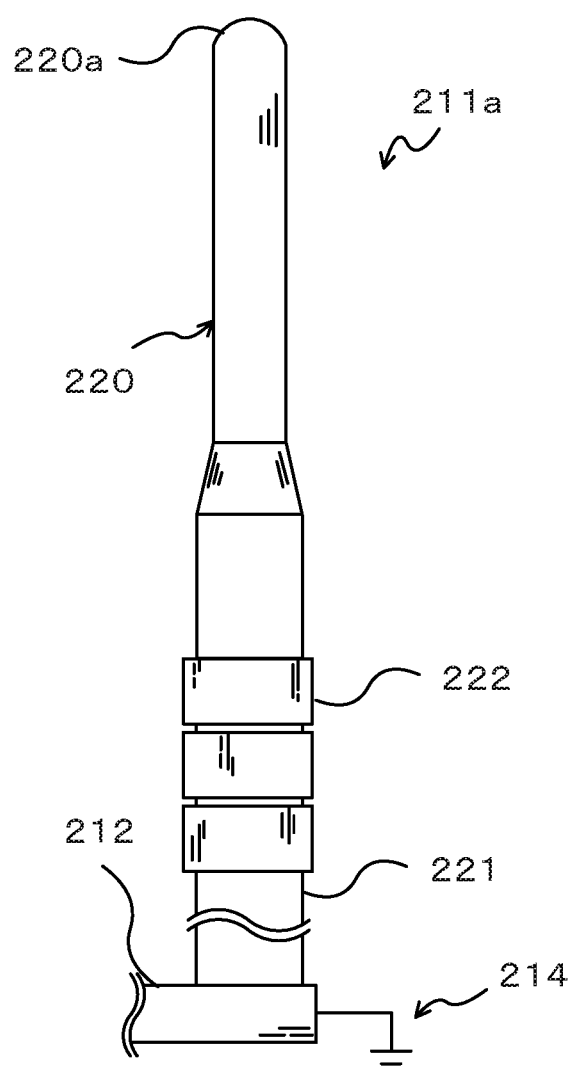
FIG. 6 is a front view schematically illustrating the outline of a configuration of a raising and lowering pin according to the embodiment.

FIG. 6 is an explanatory view schematically illustrating the outline of a configuration of the raising and lowering pin 211a. As illustrated in FIG. 6, the raising and lowering pin 211a has a main body 220 composed of a conductive resin made of, for example, polybenzimidazole (PBI) and carbon fiber (CF). A top portion of the main body 220 is a contact support 220a which comes into direct contact with the wafer W to support the wafer W. Below the main body 220, for example, a conductive material part 221 composed of a bar of SUS is provided. The main body 220 and the conductive material part 221 constitute a conductive part. The conductive material part 221 is electrically conducted to the aforementioned ground connector 214 and is thereby grounded.

At an upper outer periphery at a lower part of the main body 220 and above the conductive material part 221, a magnetic substance core 222 being an inductor part is provided. In this embodiment, for example, a soft magnetic toroidal core is used and, for example, a Ni—Zn-based ferrite core is used as a soft magnetic material.

The raising and lowering pin 211a having the above configuration functions as a low-resistance pin for leaking later-explained residual charge and inductive charge on the wafer W after the application of the treatment solution and is electrically communicated with the ground connector 214 via the ring member 212, and thus can leak the charge on the wafer W to the ground side. Note that the low resistance mentioned here means, for example, a resistance value of equal to or less than $10^5\Omega$ that is the upper limit of the electrostatic conductivity.

The remaining two of the three raising and lowering pins, namely, the raising and lowering pins 211b, 211c are composed of an insulating material having insulation properties as a whole, for example, an insulating resin such as polyether ether keton (PEEK). Having insulation properties here means having a resistance value of, for example, $10^{11}\Omega$ or more.

Further, a contact support 223 at a top portion which comes into contact with the wafer W to support wafer W of the raising and lowering pin 211b, 211c is composed of, for example, insulating rubber such as perfluororubber and thereby enhanced in holding force when coming into direct contact with the wafer W to support the wafer W. At an upper end portion of a conductive material part 225 at a lower part of the raising and lowering pin 211b, 211c, a nut 226 for adjusting height is provided. The length from the contact support 223 to the nut 226 of the raising and lowering pin 211b, 211c is set to keep an insulation distance causing no creeping discharge.

Note that in this embodiment, for example, one of the three raising and lowering pins, namely, the raising and lowering pin 211a is made into a low-resistance pin having the magnetic substance core 222. However, the number of low-resistance pins is not limited to this, but at least one or more of the plurality of raising and lowering pins provided at the substrate support 210 only need to be low-resistance pins each having the magnetic substance core 222.

Above the spin chuck 200, as illustrated in FIG. 5, a treatment solution nozzle 230 is provided which supplies a treatment solution, for example, a resist solution to the front surface of the wafer W. A lower end surface of the treatment solution nozzle 230 is formed with a discharge port 230a for supplying the treatment solution.

The treatment solution nozzle 230 is connected to a driver 232 via an arm 231. The arm 231 can move by the driver 232 along a guide rail 233 extending in a Y-direction (a right-left direction in FIG. 5) from a waiting section 234 provided at a Y-direction negative direction (left direction in FIG. 5) side outer position of a later-explained cup body 240 to above the wafer W, and supply the resist solution being the treatment solution to a position of a central portion of the wafer W. Further, the arm 231 can rise and lower by the driver 232 and adjust the height of the treatment solution nozzle 230.

As illustrated in FIG. 4, at a lateral side of the spin chuck 200, the cup body 240 is provided to surround the wafer W held by the spin chuck 200. To the cup body 240, a raising and lowering mechanism (not illustrated) is connected, and the treatment solution such as the resist solution, solvent or the like scattering from the wafer W can be received by raising the cup body 240.

Further, below the cup body 240 and the spin chuck 200, a solution receiving part 250 for collecting and draining the treatment solution collected by the cup body 240 is provided. To a bottom surface of the solution receiving part 250, a drain pipe 251 which drains gas and liquid in the solution receiving part 250 is connected, and gas-liquid separation is performed via a gas/liquid separator (not illustrated) provided on the downstream side of the drain pipe 251. The drainage after the gas-liquid separation is collected into a drainage tank (not illustrated).

Below the spin chuck 200, a circular cup attachment base 260 is provided, and an annular guide member 261 having a longitudinal section in a mountain shape is provided on the outside of the cup attachment base 260. The guide member 261 guides the treatment solution spilling down from the wafer W to the solution receiving part 250 provided outside of the cup attachment base 260.

Note that the cup attachment base 260 is provided with through holes (not illustrated) for allowing the shaft 201 and the raising and lowering pins 211a, 211b, 211c pass through.

Operation in the Solution Treatment Apparatus

When the wafer W is transferred by the transfer arm 70a of the wafer transfer apparatuses 70 into the resist coating apparatuses 32, the transferred-in wafer W is delivered from the transfer arm 70a to the raising and lowering pins 211a, 211b, 211c which have been raised and waiting in advance. Subsequently, the raising and lowering pins 211a, 211b, 211c are lowered, and the wafer W is held by the spin chuck 200.

Thereafter, the treatment solution nozzle 230 at the waiting section 234 is moved by the arm 231 to above the central portion of the wafer W, and the resist solution being the treatment solution is supplied from the discharge port 230a to the front surface of the wafer W while the spin chuck 200 is being rotated. The supplied resist solution is diffused over the entire front surface of the wafer W by the centrifugal force and thereby uniformly applied on the front surface by the spin coating method.

At the time when applying the resist solution by the spin coating method, if the resist solution is high in insulation properties, large charge is generated by rotational friction between the wafer W and the resist solution in some cases. Further, even in the case where, for example, the treatment solution is low in insulation properties, if a peripheral member (for example, the cup body 240, the cup attachment base 260, the guide member 261) is charged, the charge of a polarity opposite to that of the charge accumulated on the peripheral member sometimes comes to be accumulated on the wafer W.

In the conventional technique, in a process of transferring the wafer W to the next step in a state where the residual charge and the inductive charge on the wafer W cannot be made to leak, a potential difference is likely to occur on the wafer to cause an electric characteristic defect in an oxide film, device and the like on the wafer W.

However, as already explained, the spin chuck 200 has an electrostatic diffusive resistance value region of, for example, $10^5 \Omega$ to $10^9 \Omega$ in this embodiment, so that part of the charge accumulated on the wafer W can be made to leak without causing rapid discharge from the ground wire 203 connected via the spin chuck 200, the shaft 201, and the driver 202. However, the spin chuck 200 still has high resistance at a level of having electrostatic diffusivity, so that part of the charge does not leak through the spin chuck 200 but still remains on the wafer W.

When the wafer W after the application of the resist solution is raised by the three raising and lowering pins 211a, 211b, 211c in this state, the residual charge tries to flow via the raising and lowering pins 211a, 211b, 211c because the wafer W is ground-connected via the raising and lowering pins 211a, 211b, 211c.

In this event, the raising and lowering pin 211a has the magnetic substance core 222 as the inductor part and therefore limits current large in current change rate. More specifically, $E=-L*di/dt$ (E is a back electromotive voltage, di/dt is a current change rate, and L is inductance), namely, the back electromotive voltage E occurring in the inductor L is proportional to the current change rate di/dt, and therefore the inductor part can inhibit steep current from flowing.

The provision of the inductor part as above increases the impedance between a wafer W contact point and the ground point and limits the current flowing through the device on the wafer W. In contrast to this, with an increase in DC resistance value between the wafer contact point and the ground point as in the conventional method, namely, with an increase in insulation properties in an extreme explanation, the current flowing through the device on the wafer W can be further limited but the charge on the wafer W becomes less likely to leak on the other hand. Accordingly, as in this embodiment, the DC resistance value is decreased as much as possible down to a level at which the charge slowly leaks, and the impedance is increased so as to make the steep (ps to several nanosecond-order) current less likely to flow by the inductor part, thereby making it possible to appropriately cope with the case where an ESD current having a steep peak flows in a short period and to prevent the occurrence of the electric characteristic defect due to the flow.

Figure 7:
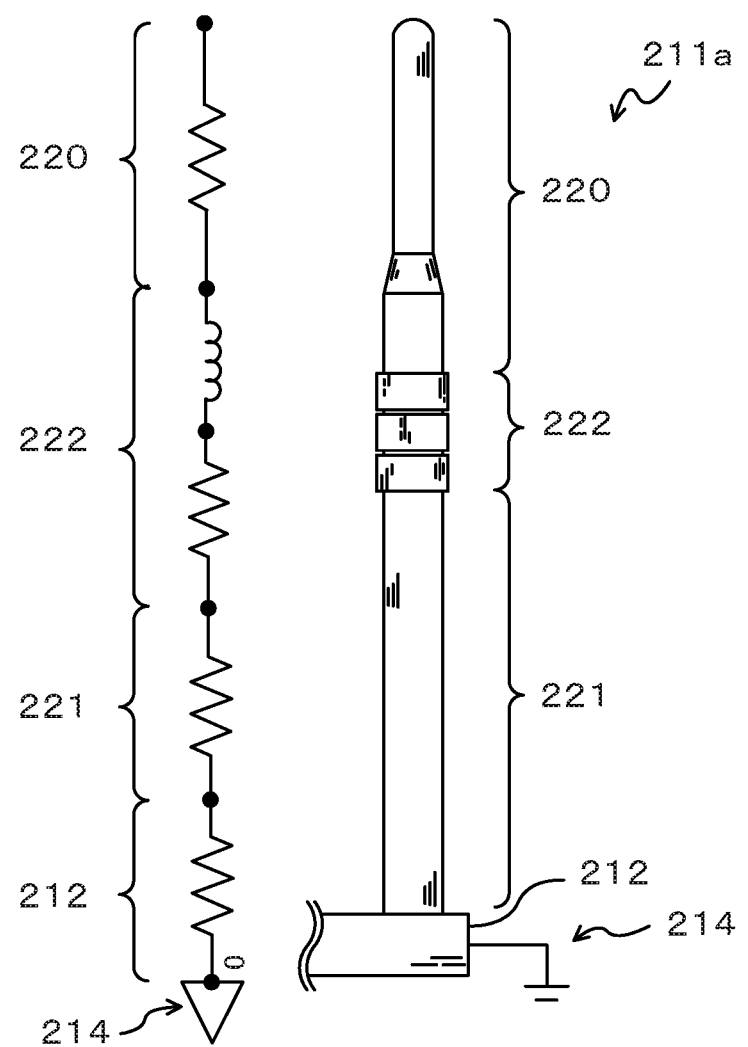
FIG. 7 is an equivalent circuit diagram of the raising and lowering pin according to the embodiment.

FIG. 7 illustrates an equivalent circuit diagram of the raising and lowering pin 211a according to this embodiment. As can be seen also from the equivalent circuit of the raising and lowering pin 211a, the magnetic substance core 222 can limit the current large in current change rate. Therefore, it is possible to make the charge on the wafer W leak from the ground connector 214 to the ground side before the wafer W is transferred to the next step while limiting a steep ESD current having a risetime of ps to several nanoseconds or less. As a matter of course, it is possible to make the charge on the wafer W leak to the ground side while limiting a long-time ESD current. Accordingly, it is possible to prevent breakage of a joint portion of the device and fusion of a wiring film.

Figure 8:
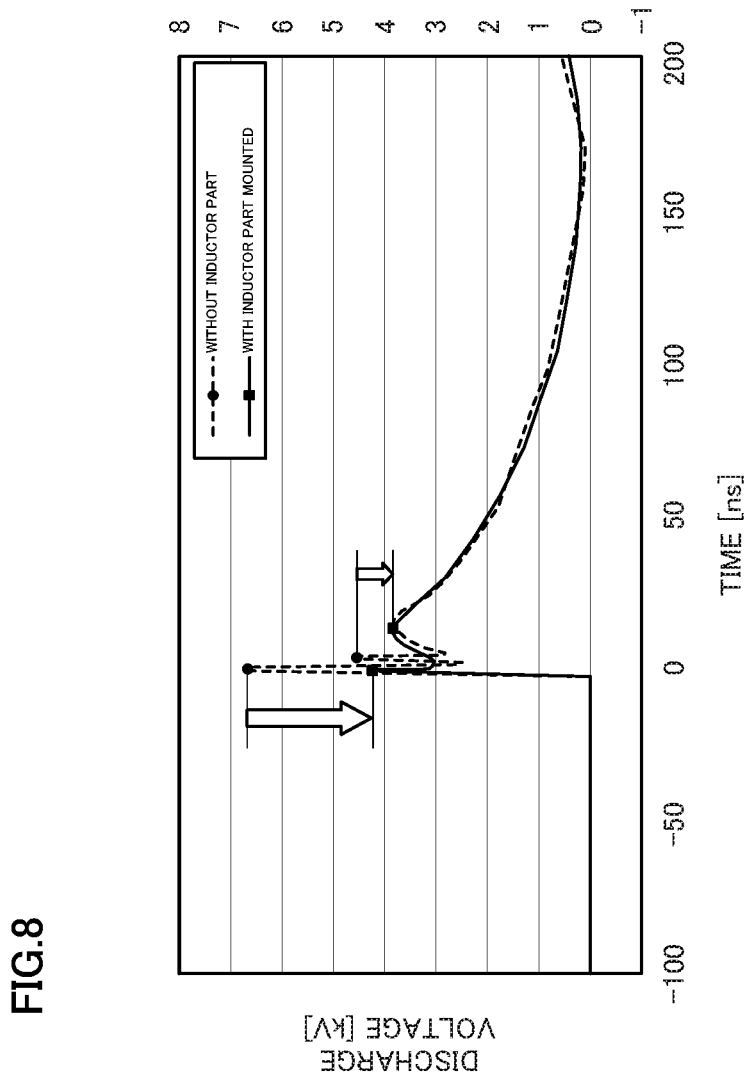
FIG. 8 is a graph illustrating an ESD suppression effect by the raising and lowering pin according to the embodiment.

FIG. 8 is a graph illustrating a comparison between discharge voltages of ESDs respectively occurring in the raising and lowering pin 211a having the magnetic substance core 222 as the inductor part and a raising and lowering pin having no inductor part. The solid line in the graph indicates the discharge voltage in raising and lowering pin having the magnetic substance core 222, and the broken line similarly indicates the discharge voltage in the raising and lowering pin having no inductor part.

As can been seen by the graph, the raising and lowering pin 211a having the inductor part has a first peak of the discharge voltage having a steep voltage change cut by about four out of ten as compared with that of the raising and lowering pin having no inductor part. Further, it can be also seen that a second peak after the first peak is alleviated in the configuration having the inductor part as in this embodiment as compared with the case having no inductor part. Accordingly, the provision of the raising and lowering pin 211a having the inductor part can minimize the voltage change on the wafer W.

The above embodiment has been explained using the resist coating apparatus 32 of the solution treatment apparatuses as an example, but the present invention is applicable not only to the resist coating apparatus 32 but also to the other solution treatment apparatuses, for example, the developing treatment apparatus 30, the lower anti-reflection film forming apparatus 31, and the upper anti-reflection film forming apparatus 33. Further, the present invention is applicable not only to the solution treatment apparatuses, but also to the apparatuses which perform the heating treatment and the cooling treatment including the thermal treatment apparatus 40, the hydrophobic apparatus 41, and the substrate treatment apparatus which treats the substrate on the stage.

Figure 9:
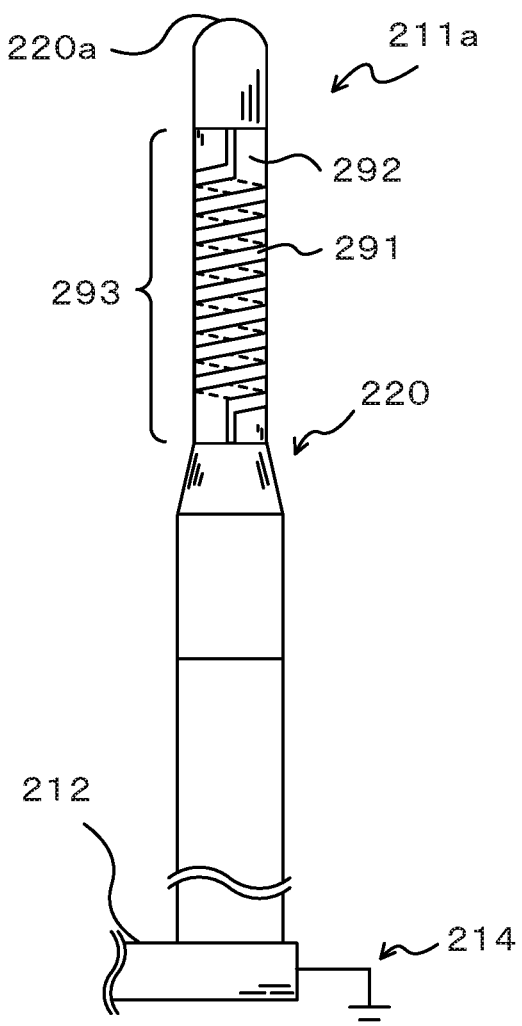
FIG. 9 is a front view illustrating the outline of a configuration of a raising and lowering pin according to another embodiment having a spiral inductor.

The raising and lowering pin 211a according to the above embodiment uses the magnetic substance core 222 as the inductor part but, in place of this, a spiral inductor 293 may be employed in which a spiral pattern composed of a conductive member is formed on the front surface of an insulating member, by a conductive member 291 composed of a conductive resin made of, for example, silicon carbide (SiC) or a resin and an insulating member 292 made of, for example, alumina ($Al_2O_3$) at an upper part of the main body 220 as illustrated in FIG. 9. The spiral inductor 293 can also limit the steep ESD current.

Figure 10:
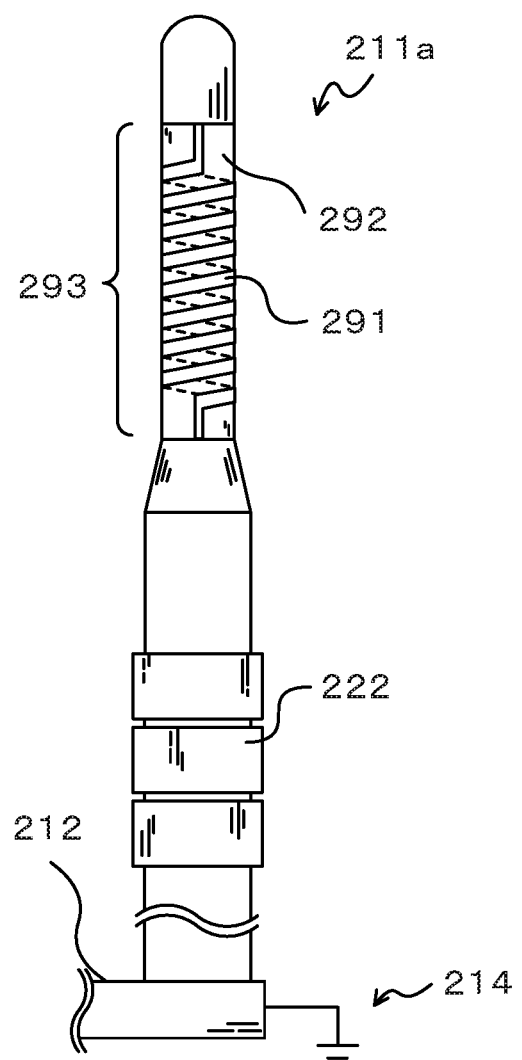
FIG. 10 is a front view illustrating the outline of a configuration of a raising and lowering pin according to another embodiment having a magnetic substance core and a spiral inductor.

Furthermore, as illustrated in FIG. 10, both the spiral inductor 293 and the above-explained magnetic substance core 222 may be employed. The configuration made by combining the inductors different in characteristic can provide an effect of attenuating a plurality of components of the ESD current.

Incidentally, once the resist coating in the solution treatment apparatus, for example, the resist coating apparatus 32 is finished, the wafer W is transferred out of the resist coating apparatus 32 by the transfer arm 70a of the wafer transfer apparatuses 70. In this case, for example, if the transfer arm 70a itself has been charged, little charge remaining on the wafer W due to the charged transfer arm 70a causes induction charge again and possibly generates ESD.

Figure 11:
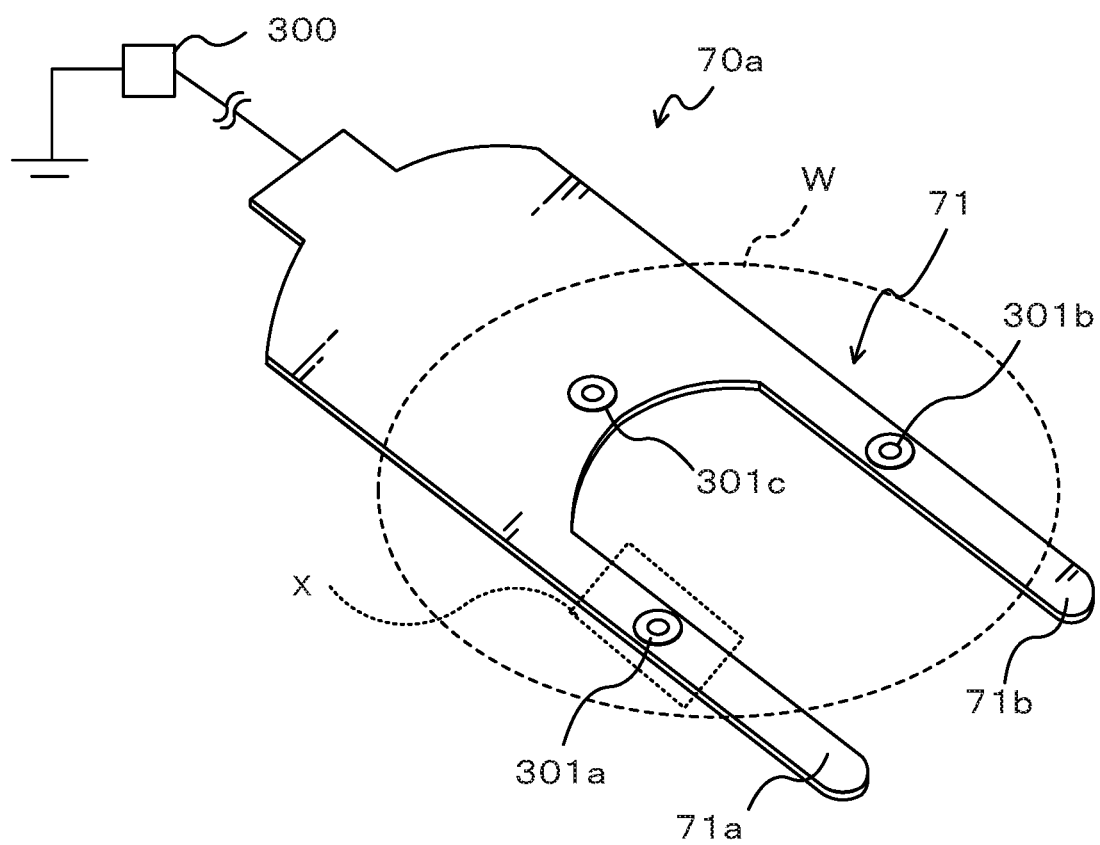
FIG. 11 is a perspective view illustrating the outline of a configuration of a transfer arm according to an embodiment.

To suppress the ESD, as illustrated in FIG. 11, it is preferable that the transfer arm 70a is constituted to be ground-connected at equal to or less than $10^9 \Omega$ that is the upper limit of the electrostatic conductivity via an equipment group 300 such as, for example, a transfer arm drive mechanism.

In this case, the entire surface of the transfer arm 70a may be coated with a conductive resin. The provision of this configuration conducts static electricity on the coating on the front surface of the transfer arm 70a, thereby preventing the transfer arm 70a itself from being charged.

However, on the upper surface of the transfer arm 70a, support pads made of a synthetic resin or the like are provided at a plurality of places, for example, three places respectively so as to support the wafer W and prevent the wafer W from being easily displaced during transfer. Therefore, if residual charge exists on the wafer W being a transfer object, an ESD current is generated at the time when the transfer arm 70a comes into contact with the wafer W as in the case of the above-explained raising and lowering pin, and possibly causes breakage of a joint portion and fusion of a wiring film due to the ESD current.

To prevent the above, as illustrated in FIG. 11, it is preferable to make also support pads 301a to 301c being contact parts with the wafer W during transfer of the wafer W surely leak slight contact charge with the wafer W. In this case, it is preferable to use a material having electrostatic conductivity and having a conductivity of $10^5 \Omega$ or less for the material of the support pads 301a to 301c. The above configuration can make the residual charge and the inductive charge on the wafer W leak through the support pads 301a to 301c and the surface portion of the transfer arm 70a.

However, even if the above means is employed, the leakage of the charge on the wafer W is still difficult in some cases. Therefore, for example, as illustrated in FIG. 12, the transfer arm 70a itself may have the configuration of the inductor part to provide the same inductor effect as that of the raising and lowering pin 211a.

In this example, one arm part 71a of arm parts 71a, 71b of an arm main body 71 that is a so-called fork in the transfer arm 70a has the configuration as the inductor part.

Figure 12:
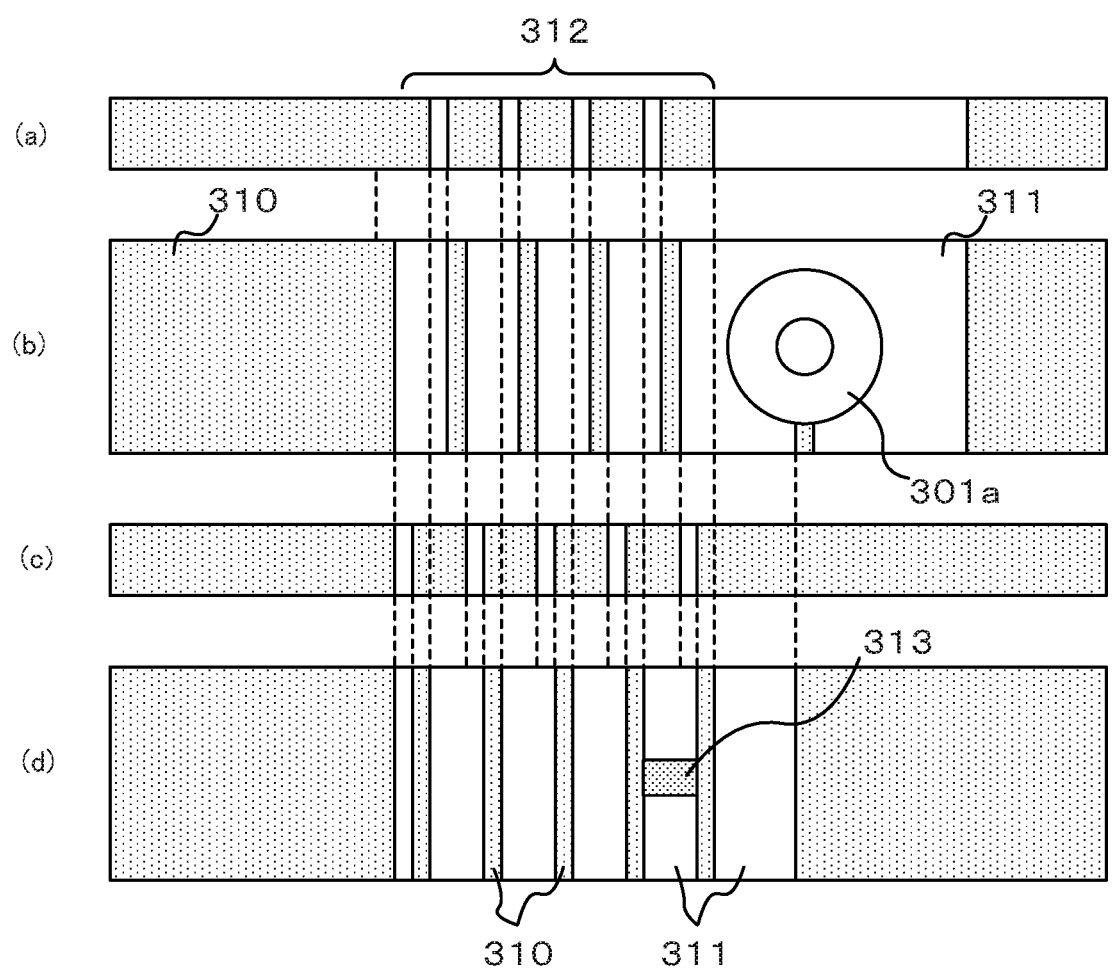
FIG. 12 is an explanatory view illustrating an enlarged configuration of an essential part of the transfer arm in FIG. 11.

Explaining the above in detail, FIG. 12 is an enlarged view of a broken line region X in FIG. 11, and FIG. 12 (a) to FIG. 12 (d) illustrate a side surface, a front surface, a side surface, and a rear surface of the arm part 71a in the broken line region X in FIG. 11, respectively. Besides, a portion indicated with many dots in FIG. 12 illustrates a conductive region 310 coated with a conductive resin, and a white portion illustrates an insulating region 311. Note that the right-direction side of the support pad 301a in the drawing is a tip end direction of the transfer arm 70a, and the left-direction side of the support pad 301a is the equipment group 300 and the ground connector side.

As illustrated in FIG. 12, in this example, a spiral inductor 312 is constituted by forming a spiral pattern of the conductive member on the surface of the insulating member at the outer periphery of a portion on the equipment group 300 side from the support pad 301a in the arm part 71a.

This can immediately attenuate also the ESD current accompanying a steep potential change having a risetime of several nanoseconds or less trying to flow via the support pad 301a and make the ESD current leak from the ground connector to the ground side. As a matter of course, it is also possible to make a long-time large current leak to the ground side. Accordingly, it is possible to prevent breakage of a joint portion and fusion of a wiring film due to the ESD current.

In this case, as illustrated in FIG. 12, a chip 313 as an inductor member may be bridged, for example, between the conductive region 310 and the insulating region 311 adjacent to each other. This can provide the chip 313 with the same function as that of the magnetic substance core 222 in the above-explained raising and lowering pin 211a. This can provide an effect of attenuating a plurality of components of the ESD current.

Further, in the above example, the spiral inductor 312 is provided only on the arm part 71a having the support pad 301a, but the spiral inductor 312 may be provided also on the arm part 71b having the support pad 301b as a matter of course.

Note that when the wafer W is transferred out by the transfer arm 70a of the wafer transfer apparatuses 70 and then the next wafer W is transferred in by the transfer arm 70a, slight ESD is sometimes generated by the induction charge when the wafer W is placed on the above-explained raising and lowering pins 211a, 211b, 211c from the transfer arm 70a. However, also when the ESD is generated as above, the generated weak ESD can be inhibited also in this case because the raising and lowering pin 211a is provided with the inductor part composed of the magnetic substance core 222.

Embodiments of the present invention have been explained above, but the present invention is not limited to the embodiments. It should be understood that various changes and modifications are readily apparent to those skilled in the art within the scope of the technical spirit as set forth in claims, and those should also be covered by the technical scope of the present invention.

INDUSTRIAL APPLICABILITY

The present invention is useful for a support member which comes into contact with a substrate and supports it, and useful for a raising and lowering pin which raises and lowers the substrate and for a transfer art which supports the substrate when transferring the substrate.

EXPLANATION OF CODES 1 substrate treatment system
70 wafer transfer apparatus
70a transfer arm
210 substrate support
211a, 211b, 211c raising and lowering pin
212 ring body
214 ground connector
220 contact support
221 conductive material part
222 magnetic substance core
240 cup body
W wafer

What is claimed is:
1. A substrate support member for supporting a substrate, comprising:
a conductive part that is entirely conductive; and
an inductor part provided below a top portion of the conductive part and around a periphery of the conductive part, wherein:
the top portion of the conductive part is a contact support configured to come into contact with the substrate and support the substrate; and a side of the conductive part opposite to the contact support across the inductor part is directly or indirectly grounded, wherein the substrate support member is configured to leak a charge on the substrate to ground via the top portion and the inductor part.

2. The substrate support member according to claim 1, wherein the inductor part is a magnetic substance core provided at an outer periphery of the conductive part.

3. The substrate support member according to claim 1, wherein:

the substrate support member is a raising and lowering pin configured to raise and lower the substrate above the stage for the substrate;

the conductive part is a main body of the raising and lowering pin; and the contact support is a top portion of the raising and lowering pin.

4. A substrate treatment apparatus for treating a substrate on a stage, the substrate treatment apparatus comprising a plurality of raising and lowering pins configured to raise and lower the substrate above the stage for the substrate, wherein:

at least one of the raising and lowering pins comprises a main body that is entirely conductive and an inductor part provided below a top portion of the main body and around a periphery of the main body;

the top portion of the main body is a contact support configured to come into contact with the substrate and support the substrate; and a side of the main body opposite to the top portion across the inductor part is directly or indirectly grounded, wherein the at least one of the raising and lowering pins is configured to leak a charge on the substrate to ground via the contact support and the inductor part.

5. The substrate support member according to claim 1, wherein the inductor part is a magnetic substance core having a toroidal shape at an outer periphery of the main body.

6. The substrate treatment apparatus according to claim 4, wherein the inductor part is a magnetic substance core provided at an outer periphery of the main body.

7. The substrate treatment apparatus according to claim 4, wherein the inductor part is a magnetic substance core having a toroidal shape at an outer periphery of the main body.

* * * * *